(12) United States Patent
Go et al.

(10) Patent No.: US 6,865,527 B2
(45) Date of Patent: Mar. 8, 2005

(54) METHOD AND APPARATUS FOR COMPUTING DATA STORAGE ASSIGNMENTS

(75) Inventors: Susie Go, Sunnyvale, CA (US); John Wilkes, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 865 days.

(21) Appl. No.: 09/740,455

(22) Filed: Dec. 18, 2000

(65) Prior Publication Data

US 2002/0077791 A1 Jun. 20, 2002

(51) Int. Cl.[7] ................................................ G06F 9/45
(52) U.S. Cl. .......................... 703/22; 707/2; 707/102; 711/170
(58) Field of Search .................... 703/22; 707/102, 707/100, 101, 2; 711/114, 170; 710/68

(56) References Cited

U.S. PATENT DOCUMENTS

| | | | | |
|---|---|---|---|---|
| 5,475,830 A | * | 12/1995 | Chen et al. | 716/16 |
| 5,742,814 A | * | 4/1998 | Balasa et al. | 707/102 |
| 6,324,678 B1 | * | 11/2001 | Dangelo et al. | 716/18 |
| 6,421,809 B1 | * | 7/2002 | Wuytack et al. | 716/2 |

* cited by examiner

*Primary Examiner*—Albert W. Paladini

(57) ABSTRACT

The present invention provides a method and apparatus for designing storage systems. Stores are clustered into workloads by using one clustering technique or a combination of two or more clustering techniques to reduce the number of constraint calculations that need to be performed. By reducing the number of constraint calculations that need to be performed, workload assignments can be generated in a reasonably short amount of time, thus enabling larger, more complex storage systems to be designed. The clustering techniques include one or more of the following: (1) clustering stores to reduce the overall number of stores, and (2) clustering stores into aggregates having storage capacity requirements and/or (3) bandwidth requirements that allow no more than a particular number of aggregates to be placed per logical unit (LU).

22 Claims, 4 Drawing Sheets

METHOD AND APPARATUS FOR COMPUTING DATA STORAGE ASSIGNMENTS

TECHNICAL FIELD OF THE INVENTION

The present invention relates to computing data storage assignments. More particularly, the present invention utilizes workload clustering strategies to compute data storage assignments that can be performed in a relatively short amount of time while satisfying performance goals and meeting resource requirements.

BACKGROUND OF THE INVENTION

In storage-design systems, the problem is to generate assignments of stores to storage device Logical Units (LUs) based on information about the workload associated with the stores. A store represents a consumer of space on a storage device, such as a file, database, database table, or file system. An LU is a unit of storage having a particular size that is selected by taking into account the capacity of the storage device so that a particular number of LUs can be efficiently placed on the storage device, with the goal of maximizing overall storage efficiency. The storage design problem is to select an assignment of stores to LUs that meet objectives, such as minimizing the cost of the system while meeting the performance needs of the workload. The workload is described in the form of one or more streams associated with each store.

The generated assignments must not violate certain constraints, such as the capacity constraint, which is simply that a storage device cannot have more stores placed onto it than will fit, and the utilization constraint, which is that a storage device cannot be busy, or utilized, more than 100% of the time. The calculation of one particular example constraint known as phased utilization is extremely time consuming. The phased utilization calculation predicts the expected utilization of a storage device taking into account the phasing behavior of the workloads applied to it. In some variants of the phased utilization calculation, the time taken to execute it grows very rapidly—certainly more than linearly—as the number of stores assigned to a storage device increases.

As a result of the computationally intensive nature of phased utilization calculations, computing complete assignments can take several days in some cases. Computing workload assignments should take on the order of minutes or seconds, not days. It would be desirable to reduce the number of constraint calculations that need to be performed so that the amount of time required to compute assignments can be reduced. It would also be desirable to reduce the number of stores that are considered during each phased utilization calculation.

By reducing and/or eliminating certain constraint calculations, the amount of time required to compute assignments can be reduced, In turn, by reducing the amount of time required to compute assignments, larger, more complex assignments can be computed. This would allow storage system design tools to generate design solutions for larger, complex storage systems in reasonable amounts of time. Accordingly, a need exists for a method and apparatus that enable the number of constraint calculations that must be performed in computing assignments to be reduced, or the number of stores considered in such calculations to be reduced, or both, thereby enabling the overall amount of time required to compute assignments to be reduced. By achieving these goals, design solutions for large, complex storage systems can be efficiently computed.

SUMMARY OF THE INVENTION

The present invention provides a method and apparatus for designing storage systems. In accordance with the present invention, stores are clustered together into clusters, or aggregates, by using one clustering technique or a combination of two or more clustering techniques that enables a reduction in the number of constraint calculations that need to be performed. By reducing the number of constraint calculations that need to be performed, workload assignments can be generated in a reasonably short amount of time, thus enabling larger, more complex storage systems to be designed.

The clustering techniques preferably include one or more of the following: (1) clustering a certain number of stores together, (2) clustering stores together into clusters that have storage capacity requirements that allow no more than a particular number of clusters to be placed on a logical unit (LU), and (3) clustering stores together into clusters having bandwidth requirements that allow no more than a particular number of clusters to be placed on a logical unit (LU). One of these techniques, or a combination of two or more of these techniques, can be utilized to reduce constraint calculations.

In accordance with the preferred embodiment of the present invention, techniques (2) and (3) are combined to produce a robust storage system design tool and method that enable the number of constraint calculations, particularly the computationally intensive phased utilization constraint calculations, to be drastically reduced.

Furthermore, the present invention includes a variety of ways of selecting the order in which stores are considered while being clustered. The ways in which the stores are ordered preferably includes the following: (1) selecting the order based on the order in which the stores are presented to the storage designer, (2) selecting the order after sorting the stores based on one or more store or stream attributes, such as capacity and I/O rate, for example, (3) selecting the order after grouping similar stores together; (4) selecting the order after grouping dissimilar stores together, and (4) selecting the order such that the stores are dynamically-chosen in combination with the clustering algorithm, thereby enabling the mixture of different store requirements to be balanced.

Other features and advantages of the present invention will become apparent from the following discussion, drawings and claims.

DETAILED DESCRIPTION OF THE INVENTION

In accordance with the present invention, a method is provided for reducing the number of constraint calculations that must be performed when computing storage assignments for workloads, thereby reducing the overall amount of time required to compute the storage assignments. The method of the present invention includes several distinct techniques for reducing the constraint calculations. Any one of the techniques can be used without the others to reduce the number of constraint calculations. Alternatively, two or more of these techniques can be combined to achieve a more robust method for reducing the number of constraint calculations that must be performed. A detailed discussion of each of these techniques and the manner in which they can be combined to reduce constraint calculations will now be provided.

Figure 1:
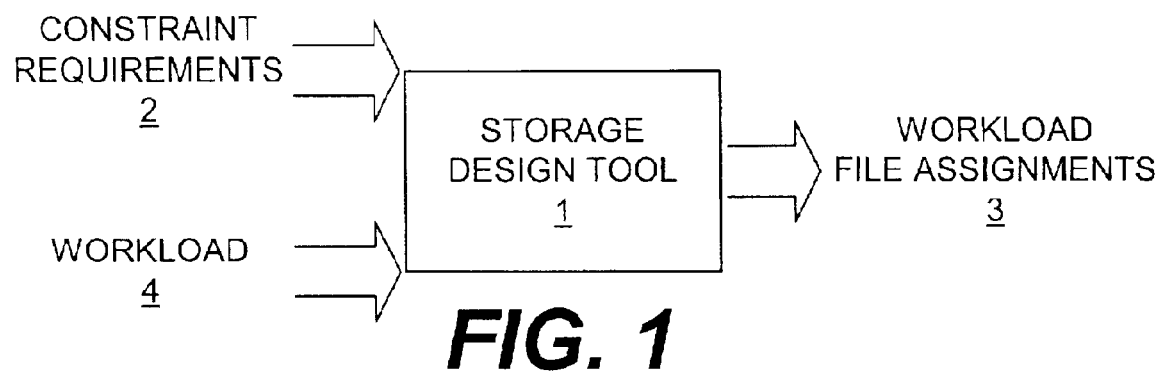
FIG. 1 is a block diagram of the storage system design tool of the present invention.

FIG. 1 is a block diagram of the apparatus of the present invention. The apparatus 1 of the present invention is a storage system design tool. The storage system design tool 1 receives as its input a set of constraint requirements 2, and a workload 4, and produces an output in the form of an assignment of stores 3 to storage devices, including streams associated with stores. The assignment includes information relating to the device and device locations to which the stores and associated streams will be assigned. By performing these tasks, the storage system design tool 1 is able to design high-quality assignments for real storage systems.

Figure 2:
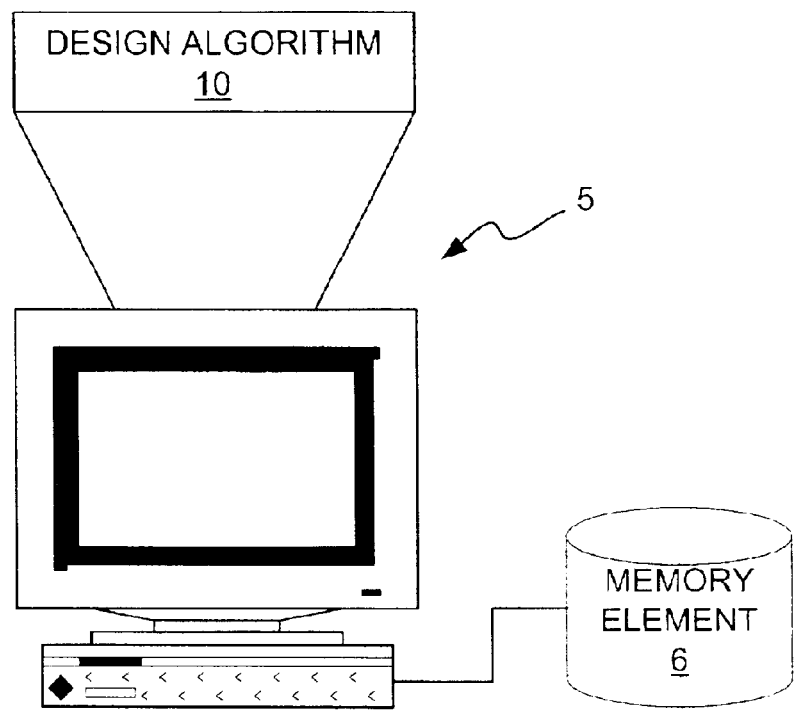
FIG. 2 is a pictorial representation of the computer and algorithm that are comprised by the design tool shown in FIG. 1.

The storage system design tool 1 of the present invention comprises a computer 5, as shown in FIG. 2, which performs a design algorithm 10 that computes the assignments. The computer 5 is in communication with a memory element 6 that stores information utilized by the computer 5 to compute the assignments. Preferably, the computer 5 includes one or more processors that execute one or more software programs comprising the design algorithm 10 to compute the assignments. Therefore, the design algorithm 10 that computes the assignments preferably is implemented as one or more software programs that are executed by the computer 5 to compute the assignments. However, it will be understood by those skilled in the art that the design algorithm 10 for computing the assignments can be implemented solely in hardware, or in a combination of hardware and software or firmware.

The term "computer", as that term is used herein, is intended to denote any machine capable of receiving an input and of processing the input in accordance with a rule set to compute an output. Therefore, the computer 5 of the present invention is not limited to any particular type of computer or logic configuration. Those skilled in the art will understand the manner in which various logical configurations can be implemented to achieve the functions of the storage design tool 1 of the present invention.

Figure 3:
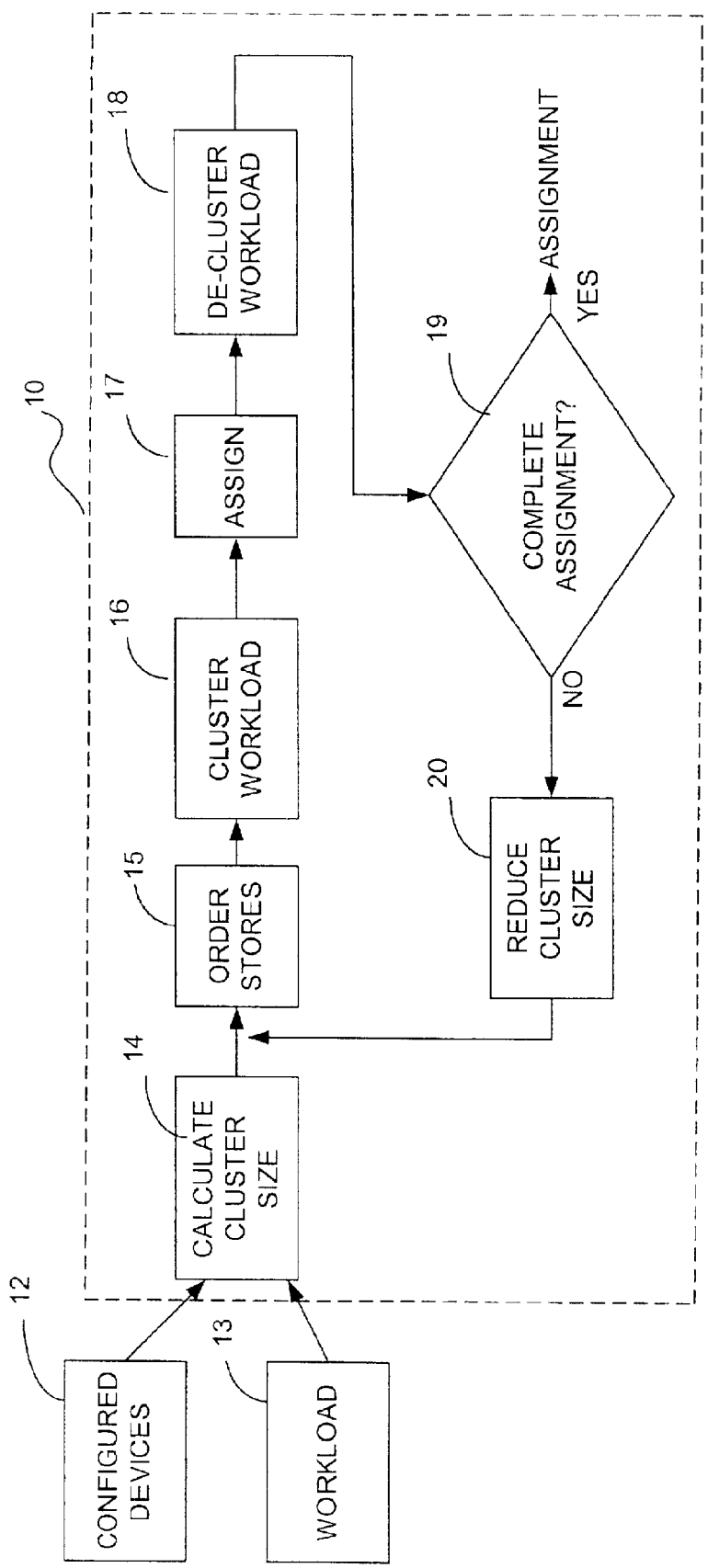
FIG. 3 is a flow chart illustrating the manner in which assignments are generated by the design tool shown in FIG. 1.

FIG. 3 is a block diagram illustrating the functions performed by the storage system design algorithm 10 of the present invention. The general concept and practical application of the present invention is to cluster stores and their associated streams together to reduce the number of constraint calculations that need to be performed, thereby reducing the amount of time needed to compute assignments. There are several ways that the clustering can be performed, and some clustering techniques may produce better results than others, as discussed below in detail with reference to FIGS. 4A–5E. In all cases, the objective is to reduce the overall amount of time required to compute assignments with little or no degradation of the quality of the design solutions.

The first step in the process is to configure the storage device(s) that are going to be used for storing the stores and associated streams, as indicated by block 12. The type of device(s) that the stores/streams will be placed on is known a priori and this information is utilized to determine the size of the LU that will be used. This information is then utilized to calculate the initial cluster size, as indicated by block 14.

The workload, represented by block 13, corresponds to sets of stores and their associated stream or streams. Each stream designates certain performance properties associated with the workload applied to the store to which it is bound, such as, for example, the rate of I/O (input/output) requests. Therefore, the stream information associated with the stores generally must be preserved.

There are many ways in which the functions to determine the cluster size (represented by block 14) can be performed. The issue addressed at block 14 generally is, what is the best way to clump stores together to obtain a cluster that will produce the best assignment. Various constraints can be taken into account in determining the cluster size, such as, for example, the capacity and performance of the underlying LU, whether the LU is a RAID 1 or RAID 5 store, etc., as is generally known in the art. Choosing the optimum cluster size has to balance improvements in the speed of performing the constraint calculations against decreasing the quality of the resulting assignment: if the cluster is too small, then it may not reduce the calculation time sufficiently; if the cluster is too large, then it may result in inefficient assignments (e.g., because of fragmentation effects).

The next step in the design algorithm 10 is to order the workload, as indicated by block 15. The issue addressed at block 15 generally is, what is the best order to consider the stores during the clustering step. The manner in which the workload may be ordered will be discussed below with reference to FIGS. 5A–5E. The next step in the design algorithm 10 is to cluster the workload, as indicated by block 16. The issue addressed at block 16 generally is, what is the best way to clump stores together to obtain clusters that will produce the best assignment. The manner in which the workload may be clustered will be discussed below with reference to FIGS. 4A–4D. Once the stores have been clustered, the clusters are assigned, as indicated by block 17. The assignment step is accomplished by performing the aforementioned constraint calculations on a cluster level, as opposed to other techniques which performed the assignment step on a per store level, which required that the constraint calculations be performed for each store.

Once the assignments have been made, the workload is de-clustered, as indicated by block 18. Essentially, once several stores have been clustered together into a cluster, and this cluster has been assigned, the workload must be separated out into the individual, original stores and streams. A determination is then made as to whether the assignment was complete, i.e., whether all of the stores that needed to be assigned were in fact assigned to a storage device. If so, the assignment is output. If not (this can happen for a variety of reasons, including there not being sufficient storage devices to hold a poorly-clustered workload), the cluster size is reduced by some amount at the step represented by block 20 and the process returns to the step represented by block 15. Steps 15–20 are repeated until a complete assignment has been generated, or until no further progress can be made.

The amount by which the cluster size is reduced is not critical. Preferably, the cluster size is initially calculated at the step represented by block 14 so that the average LU capacity and bandwidth availability enable placement of 10 clusters per LU. The reduction in clustering size performed at the step represented by block 20 can be a random reduction of the clustering size or a multiplication of the clustering size by some pre-selected fraction, which is either constant or variable. The larger the reduction in size of the cluster, the fewer times around the loop (steps 15–20) will be needed, but the more likely it is that the constraint calculation costs will increase rapidly as the cluster sizes become small, and the number of clusters increases rapidly. Therefore, these interests should be balanced in order to enable assignments to be generated quickly and efficiently. Those skilled in the art will understand the manner in which these factors should be balanced to provide quality solutions while reducing the amount of time that is required to complete assignments.

FIGS. 4A–5E will now be discussed to demonstrate the manner in which the various techniques, and/or combinations of these techniques, can be utilized to reduce constraint calculations. The first method of the present invention is represented by block 22 in FIG. 4A. At step 15 in FIG. 3, clusters are formed by collecting together groups of n stores (e.g., n=5, 10, 20, 100, etc.), in the order they appear in the workload description. The manner in which this step is accomplished is as follows. The first n stores in a workload are replaced with a new store whose capacity is the sum of these stores. The streams that were bound to the original stores are re-bound to the new cluster, in a way that allows the binding to be reversed in step 18. This process is repeated for all the stores in the workload, until they have all been clustered.

In accordance with this method of the present invention, the constraint calculations are performed for each cluster of stores, instead of for every store in the original, un-clustered workload. For example, this calculation may be performed only once for each attempt to assign a cluster, rather than every time an attempt is made to assign a store. This technique reduces the number of constraint calculations that must be performed by roughly a factor of n because assignments of stores are made n at a time.

Figure 4A:
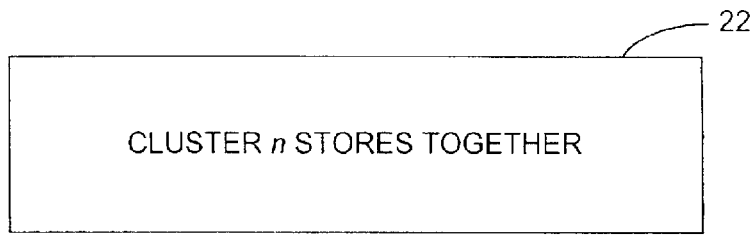
FIGS. 4A–4D illustrate methods of the present invention for clustering stores in order to reduce the number of constraint calculations that need to be performed.
Figure 4B:
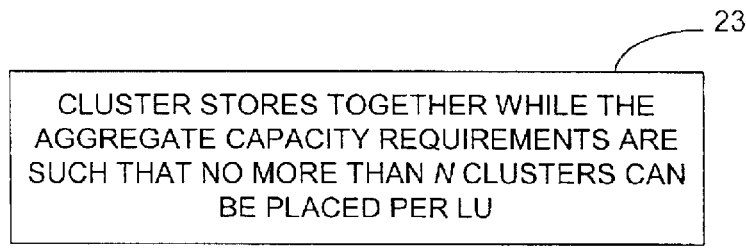

Block 23 in FIG. 4B represents an alternative method for clustering stores: capacity-based clustering. In accordance with this method, the number of stores in a cluster is determined by setting an upper bound on the cluster's aggregate capacity requirements—typically by choosing a size that will allow no more than a particular number of clusters to be placed per LU. This technique reduces calculations by batching stores in a more intelligent way than simply clustering the first n stores, as discussed above with reference to FIG. 4A. The design algorithm 10 utilizes a parameter, N, which specifies the maximum number of clusters to fit per LU. Preferably, the average LU size for the device(s) is provided and a target cluster capacity C is calculated to be this size divided by N. Generally, a target capacity threshold (which must be C or below) is also chosen, and only those stores having capacities that are less than the capacity threshold are considered for clustering. The design algorithm 10 takes stores and adds them, preferably one at a time, to a cluster while the target capacity C has not yet been reached. The cluster is then used to replace the original stores in the workload fed to the assign step 17, and any streams associated with the original stores are re-bound to the new clustered store.

Figure 4C:
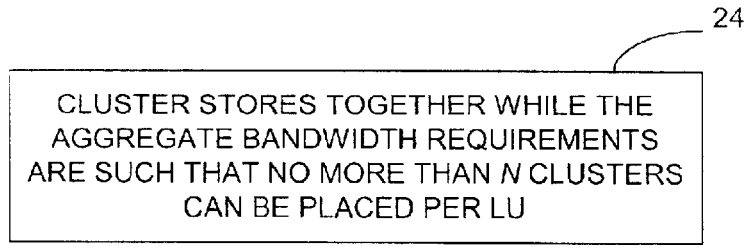

FIG. 4C represents yet another embodiment for reducing constraint calculations. The step represented by block 24 enables calculations to be batched by generating clusters that are bandwidth-based. In other words, stores are clustered into clusters having bandwidth requirements that enable no more than a particular number of such aggregates to be placed on a LU. This technique reduces calculations by performing batching in a more intelligent way than batching by simply taking the first n stores, as in step 22 of block 4A. The design algorithm 10 utilizes a parameter, N, which specifies the maximum number of aggregates to fit per LU. Preferably, the average LU bandwidth for the device(s) is provided and a target cluster bandwidth B is calculated to be this value divided by N. Generally, a target bandwidth threshold (which must be B or below) is also chosen, and only those stores having streams whose aggregate demands are less than the bandwidth threshold will be considered for clustering. The LU and stream I/O rate can be used in place of the bandwidth in this method.

Figure 4D:
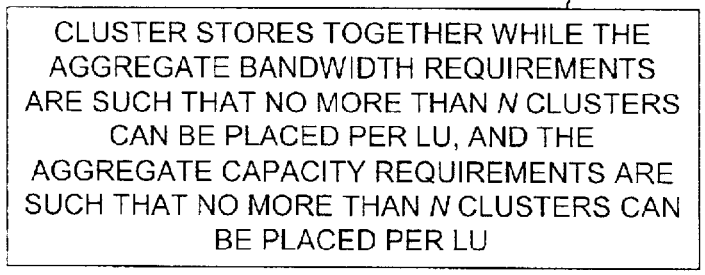

FIG. 4D represents an embodiment in which the stores are clustered into aggregates having storage capacity requirements and bandwidth requirements that prevent more than a particular number, N, of the aggregates to be placed per logical unit (LU).

This method is performed as follows. A list of the stores to be clustered is generated. The design algorithm 10 takes stores and adds them, preferably one at a time, to a cluster while the target bandwidth B has not yet been reached. The cluster is then used to replace the original stores in the workload fed to the assign step 17 (FIG. 3), and any streams associated with the original stores are re-bound to the new clustered store. Preferably, this method is performed conservatively by assuming that all the streams are correlated (i.e., all of the bandwidths are added to generate a worst-case situation). The result is a new workload having this clustered store with the total capacity of the component stores and all associated streams re-bound to it, in a way that allows the binding to be reversed in step 18 (FIG. 3).

FIGS. 5A–5E represent alternative embodiments of the method of the present invention performed by the design algorithm 10 in order to order the stores for consideration by the clustering algorithm represented by block 16 in FIG. 3. By performing such an ordering, the quality of the clustering—and of the final assignment—can be improved.

Figure 5A:
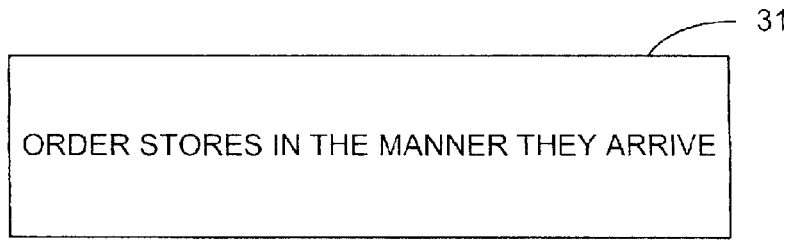
FIGS. 5A–5E illustrate methods of the present invention for selecting the order in which stores are considered for clustering.

In FIG. 5A, block 31 represents the method that accepts stores input in the order they were received by the design tool 10.

Figure 5B:

In FIG. 5B, block 32 represents the method that randomly re-orders the stores before they are considered. Different runs of the same design tool 10 may thus produce different assignment results; the best of these can be selected as the preferred assignment.

Figure 5C:
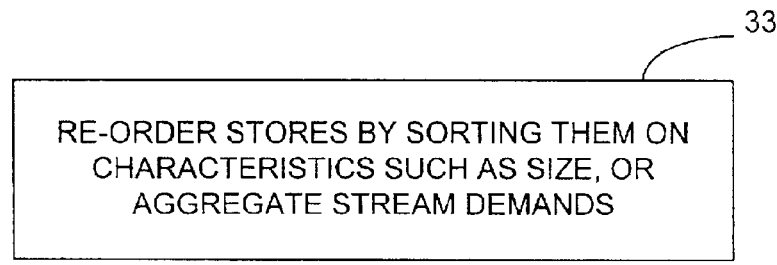

In FIG. 5C, block 33 represents the method that first orders the stores by sorting them based on one or more attributes of the stores themselves or their associated streams, or both. Examples this technique include, for example, sorting stores by their capacity, or by the aggregate I/O rate of their associated streams, or both.

Figure 5D:
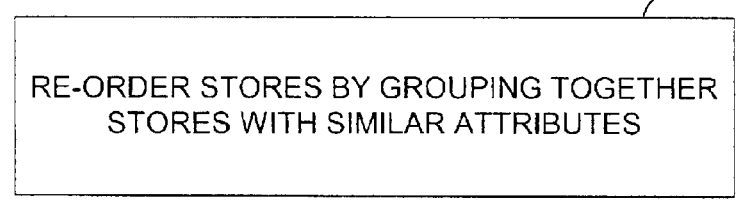

In FIG. 5D, block 34 represents the method that first orders the stores by grouping "similar" stores together, such as, for example, stores with the same reliability or storage-class requirements, special layout requirements, or importance (a measure that takes into account the value of including the store in the assignment). Having done this, only stores with the same attribute values are clustered together. Although this may increase the number of clusters, it will also ensure that only compatible stores are considered together in a single cluster.

Figure 5E:
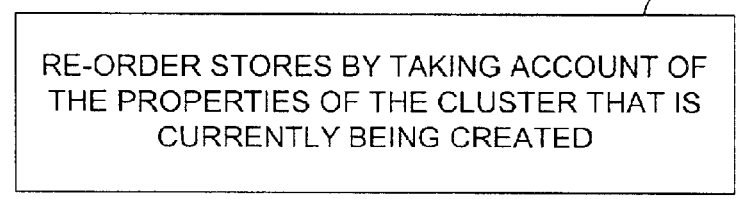

In FIG. 5E, block 35 represents the method that selects the next store to consider by taking account properties of the current cluster. For example, if the stores in a cluster are currently close to the cluster capacity limit, but the aggregate I/O rate is low compared to the cluster limit, then the method would search for a next store to be considered that has a small capacity but high I/O rate. Similarly, the method might select only stores that will still fit in the current cluster, if any remain.

Each of the ordering methods represented by blocks 31–35 in FIGS. 5A–5E may be combined with each of the clustering methods represented by blocks 22–25 in FIGS. 4A–4D. The preferred embodiment of the present invention combines the method of block 32 with the method of block 25. In accordance with the preferred embodiment of the present invention, the stores are first randomly ordered, as indicated by block 32. Then, the stores are clustered in the manner indicated by block 25 before being passed to the assignment step 17. In the step represented by block 14, the calculation of cluster size is based on the average LU capacity and array or device bandwidth available to fit a particular number of stores per LU. Experimental results have indicated that the optimum number of stores per LU is roughly 10, although the present invention is not limited to any particular number of stores per LU.

Therefore, it can be seen that the present invention enables the number of constraint calculations that must be performed, to be reduced. In some cases, constraint calculations are reduced by multiple orders of magnitude. Other clustering strategies include batch calculations based on assembly line criteria. In other words, clustering stores/streams with similar attributes and processing them collectively or in some orderly way. For instance, once a LU has been filled with stores in an efficient way, other LUs may be filled with a similar collection of stores. Thus, prior workload clustering knowledge is used to quickly and efficiently make assignments.

Another alternative technique for clustering workloads would be to cache recent or partial calculations. In other words, recent or partial calculations would be saved to avoid repetition. This technique would also reduce constraint calculations.

The manner in which one of these techniques can be implemented by itself or in combination with others to reduce the number of constraint calculations that need to be performed has been demonstrated herein through exemplary embodiments. Those skilled in the art will understand that modifications can be made to the embodiments discussed herein and that any such modifications are within the scope of the present invention. It should also be noted that the present invention is not limited to designing storage systems, but is equally applicable to other constrain-based design systems where constraint-based calculations have, in the past, or traditionally, have been performed on a per workload basis. Such systems can benefit from the teachings provided herein of clustering workloads in a variety of manners to enable constraint-based calculations to be performed on a per-cluster basis, rather than on a per-workload basis. Those skilled in the art will understand the manner in which the techniques of the present invention can be used with other types of constrain-based design systems.

What is claimed is:

1. A method for computing assignments of data stores to storage device logical units for a data storage system design comprising:
    selecting a plurality of data stores for each of a plurality of data store clusters;
    clustering the selected data stores thereby forming the data store clusters; and
    assigning the data store clusters to the storage device logical units using a machine-implemented design algorithm by which constraint calculations are performed at the cluster level for each data store cluster.

2. The method according to claim 1, wherein said selecting a plurality of data stores for a particular one of the data store clusters comprises selecting the data stores according to an order in which the data stores are presented.

3. The method according to claim 1, wherein said selecting a plurality of data stores for a particular one of the data store clusters comprises selecting the data stores in random order.

4. The method according to claim 1, wherein said selecting a plurality of data stores for a particular one of the data store clusters comprises selecting the data stores according to an order in which the data stores are sorted based on characteristics of the data stores.

5. The method according to claim 4, wherein the characteristics include size of the stores.

6. The method according to claim 4, wherein the characteristics include aggregate stream demands.

7. The method according to claim 1, wherein said selecting a plurality of data stores for a particular one of the data store clusters comprises selecting the data stores according to an order in which the data stores are sorted based on similarity of characteristics.

8. The method according to claim 7, wherein the characteristics include reliability or storage class requirements.

9. The method according to claim 7, wherein the characteristics include layout requirements.

10. The method according to claim 7, wherein the characteristics include importance.

11. The method according to claims 1, wherein said selecting a plurality of data stores for a particular one of the data store clusters comprises selecting the data stores according to an order in which the data stores are sorted based on desired properties for a particular data store cluster.

12. The method according to claim 1, wherein said clustering the selected data stores for a particular one of the data store clusters comprises clustering a determined number of the data stores together.

13. The method according to claim 1, wherein said clustering the selected data stores is based on capacity.

14. The method according to claim 13, wherein aggregate capacity requirements of the data store clusters prevent more than a particular number, N, of the data store clusters from being assigned per logical unit.

15. The method according to claim 1, wherein said clustering the selected data stores is based on bandwidth.

16. The method according to claim 15, wherein aggregate bandwidth requirements of the data store clusters prevent more than a particular number, N, of the data store clusters from being assigned per logical unit.

17. The method according to claim 1, wherein said clustering the selected data stores is based on capacity and bandwidth wherein aggregate capacity and bandwidth requirements of the data store clusters prevent more than a particular number, N, of the data store clusters from being assigned per logical unit.

18. The method according to claim 17, wherein said selecting a plurality of data stores for a particular one of the data store clusters comprises selecting the data stores in random order.

19. The method according to claim 1, further comprising de-clustering the data stores.

20. The method according to claim 1, further comprising determining whether all of the data stores have been assigned and, if all of the data stores have been assigned, outputting a resulting assignment.

21. The method according to claim 1, further comprising determining whether all of the data stores have been assigned and, if not all of the data stores have been assigned, reducing a cluster size and repeating said steps of selecting, clustering and assigning.

22. A computer-readable medium having stored thereon a computer program for performing a method of designing storage systems, the method comprising steps of:

selecting a plurality of data stores for each of a plurality of data store clusters;

clustering the selected data stores thereby forming the data store clusters; and assigning the data store clusters to the storage device logical units using a machine-implemented design algorithm by which constraint calculations are performed at the cluster level for each data store cluster.

* * * * *